US008284568B2

(12) United States Patent
Xiao

(10) Patent No.: US 8,284,568 B2
(45) Date of Patent: Oct. 9, 2012

(54) KEY BUTTON MECHANISM AND PORTABLE ELECTRONIC DEVICE USING SAME

(75) Inventor: Zhi-Qiang Xiao, Shenzhen (CN)

(73) Assignees: Shenzhen Futaihong Precision Industry Co., Ltd., ShenZhen, Guangdong Province (CN); FIH (Hong Kong) Limited, Kowloon (HK)

( * ) Notice: Subject to any disclaimer, the term of this patent is extended or adjusted under 35 U.S.C. 154(b) by 240 days.

(21) Appl. No.: 12/893,017

(22) Filed: Sep. 29, 2010

(65) Prior Publication Data

US 2011/0228494 A1 Sep. 22, 2011

(30) Foreign Application Priority Data

Mar. 19, 2010 (CN) .......................... 2010 1 0127404

(51) Int. Cl.
*H05K 7/02* (2006.01)
*H05K 7/04* (2006.01)

(52) U.S. Cl. ......................... 361/810; 361/748; 361/809

(58) Field of Classification Search .................. 361/720, 361/736, 748, 760, 807, 809, 810
See application file for complete search history.

(56) References Cited

U.S. PATENT DOCUMENTS

| | | | | |
|---|---|---|---|---|
| 6,148,183 | A * | 11/2000 | Higdon et al. | 455/575.1 |
| 7,034,238 | B2 * | 4/2006 | Uleski et al. | 200/500 |
| 7,554,050 | B1 * | 6/2009 | Lv | 200/339 |
| 7,812,271 | B2 * | 10/2010 | Lee et al. | 200/5 R |
| 7,990,695 | B2 * | 8/2011 | Lv | 361/679.3 |
| 8,017,882 | B2 * | 9/2011 | Yang et al. | 200/343 |
| 8,089,772 | B2 * | 1/2012 | Chen | 361/752 |

* cited by examiner

*Primary Examiner* — Hung S Bui
(74) *Attorney, Agent, or Firm* — Altis Law Group, Inc.

(57) ABSTRACT

A key button mechanism and a portable electronic device using same are provided. The key button mechanism includes a key button and an elastic element integrally formed with the key button. The elastic element includes a main body and two elastic arms extending out, backward from the main body and located at two opposite ends of the main body respectively. The main body includes two resisting blocks protruding from one surface thereof away from the key button side and are located adjacent to the two opposite ends of the main body.

14 Claims, 4 Drawing Sheets

KEY BUTTON MECHANISM AND PORTABLE ELECTRONIC DEVICE USING SAME

BACKGROUND

1. Technical Field

This disclosure relates to key button mechanisms, particularly to key button mechanisms used in a portable electronic device.

2. Description of Related Art

Many portable electronic devices such as mobile phones, have housings with interior compartments for receiving printed circuit boards (PCBs) therein. The mobile phone usually includes a key button mechanism attached to an outer sidewall of the housing for implementing additional functions. Users can directly operate the key button mechanism to conveniently control the mobile phone. However, typical key button mechanisms often occupy a large space of the housing, and can be difficult to actuate.

Therefore, there is a room for improved in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary key button mechanism and portable electronic device using same. Moreover, in the drawings like reference numerals designate corresponding parts throughout the several views. Wherever possible, the same reference numerals are used throughout the drawings to refer to the same or like elements of an embodiment.

DETAILED DESCRIPTION

The key button mechanism is assembled to a side portion of a portable electronic device such as a mobile telephone, for controlling or operating the portable electronic device conveniently as a function key. The mobile telephone described herein is a representation of the type of wireless communication device that may benefit from the exemplary embodiment. However, it is to be understood that the exemplary embodiment may be applied to any type of hand-held or portable device including, but not limited to, the following devices: radiotelephones, cordless phones, paging devices, personal digital assistants, portable computers or keyboard-based handheld devices, remote control units, and portable media players (such as an MP3 or DVD player). Accordingly, any reference herein to the mobile telephone should also be considered to apply equally to other portable electronic devices.

Figure 1:
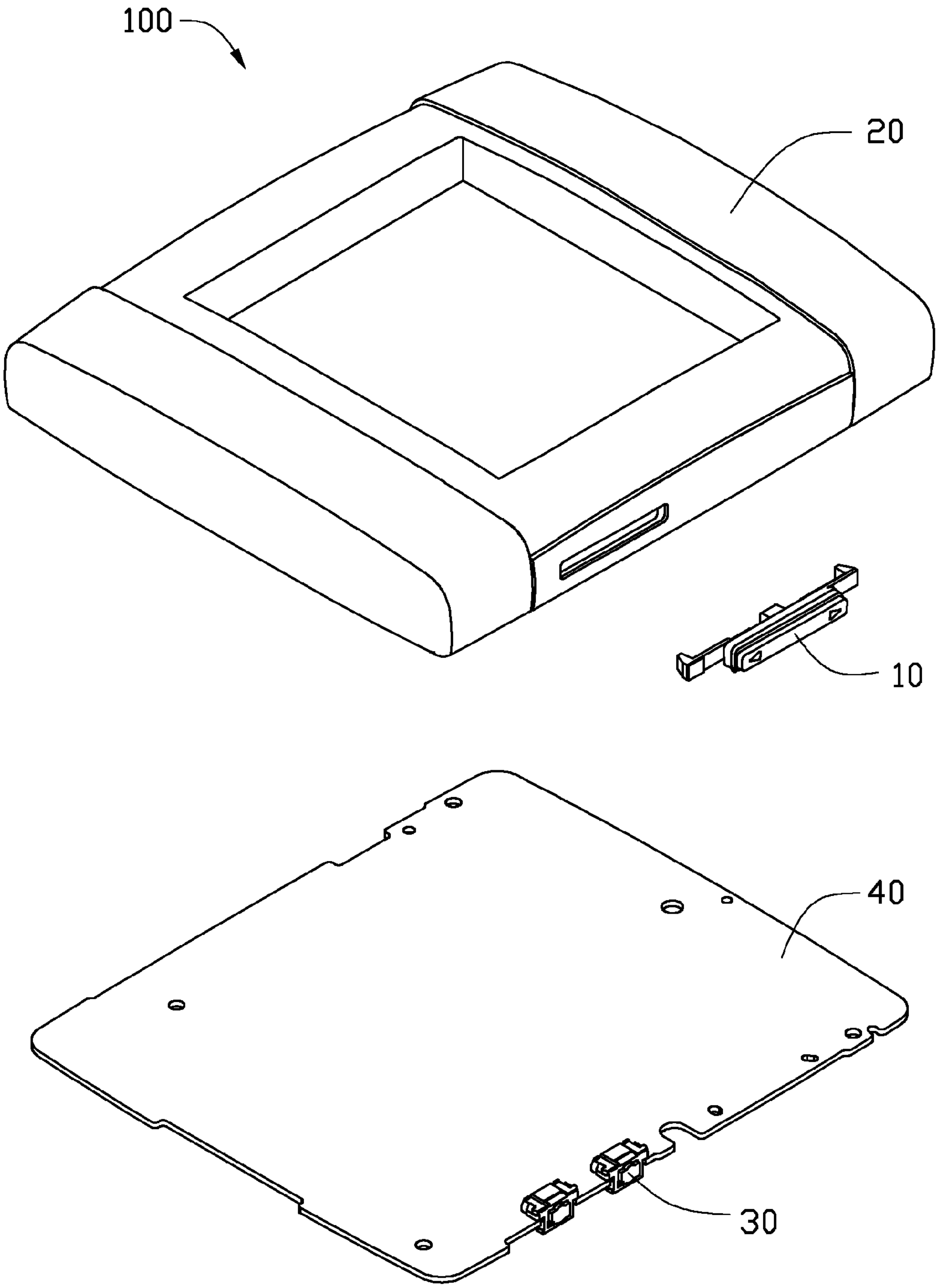
FIG. 1 is an exploded perspective view of an exemplary embodiment of a portable electronic device.

Referring to FIG. 1, there shows an exploded perspective view of an exemplary embodiment of a portable electronic device 100 including a key button mechanism 10, a housing 20, at least two switches 30 and a circuit board 40. The key button mechanism 10 and the circuit board 40 are assembled to the housing 20. The two switches 30 are electrically mounted on the circuit board 40 and in a position separated apart from each other corresponding to the key button mechanism 10. The two switches 30 are triggered by pressing the corresponding key button mechanism 10, and thereby generating an electronically controlled signal transmitted to the circuit board 40 for controlling the portable electronic device 100.

Figure 2:
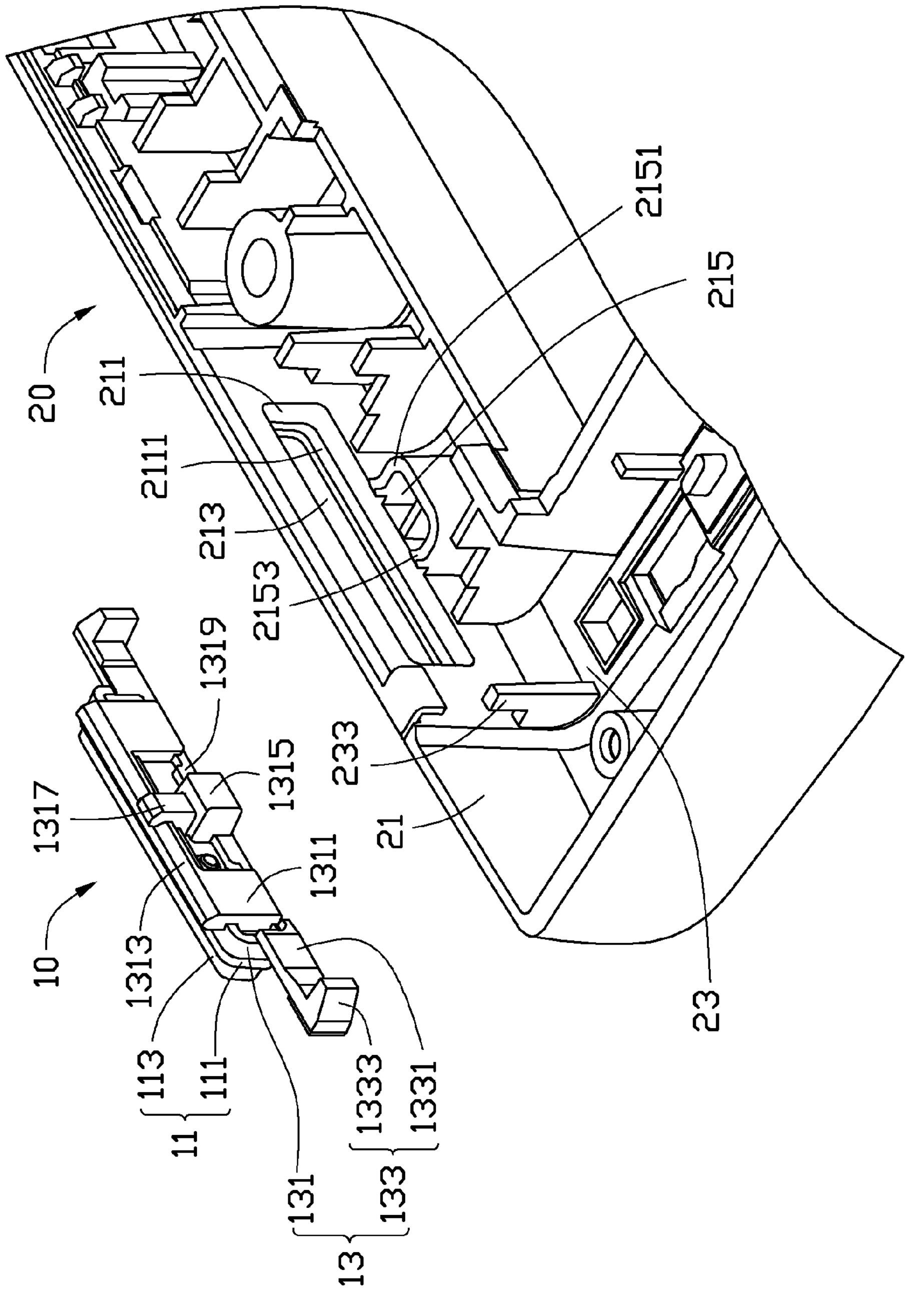
FIG. 2 is another exploded partial perspective view of the portable electronic device shown in FIG. 1.

Also referring to FIG. 2, the key button mechanism 10 includes a key button 11 and an elastic element 13 integrally formed with the key button 11. In the exemplary embodiment, the key button 11 is made of rigid plastic material such as polycarbonate, and the elastic element 13 is made of elastic material such as thermoplastic polyurethanes. The key button 11 and the elastic element 13 may be manufactured by double-colored injection molding technology. The key button 11 is substantially stepped shaped and includes a key body 111 and a pressing portion 113 protruding from a surface of the key body 111. The pressing portion 113 is substantially longitudinal bar shaped, and can be pressed on two distal end thereof.

The elastic element 13 is formed on the other surface of the key body 111 opposite to the pressing portion 113. The elastic element 13 includes a main body 131 and two elastic arms 133 extending from the main body 131 and are located at opposite ends of the main body 131 respectively. The main body 131 is substantially rectangular block shaped having substantially the same shape and size as the key body 111 of the key button 11. Two resisting blocks 1311 protrude from one surface of the main body 1313 away from the pressing portion 113 side and are disposed adjacent to opposite ends of the main body 1313 corresponding to the two switches 30. The two resisting blocks 1311 are for resisting against the corresponding two switches 30 to trigger and generate electronic controlling signals transmitted to the circuit board 40 for controlling the portable electronic device 100.

A resisting wall 1313 is formed beside the main body 131 with two distal ends thereof connecting with the two resisting blocks 1311, thereby, the resisting wall 1313 and the two resisting blocks 1311 together form a substantially U-shaped cross section. The resisting wall 1313 is to resist against the housing 20, as the key button mechanism 10 is assembled to the housing 20. A substantially rectangular protrusion 1315 protrudes from the main body 131 and is positioned between the two resisting blocks 1311. A limiting stopper 1317 extends out from the protrusion 1315 toward and cross the resisting wall 1313. The limiting stopper 1317 is located in front of the circuit board 40 during use and is to prevent the key button mechanism 10 from being over pressed, i.e., pressing the key button mechanism 10 too deeply. When the pressing portion 113 of the key button mechanism 10 is prone to being over pressed in use toward the housing 20, the limiting stopper 1317 can resist against the circuit board 40. Two ribs 1319 extend from opposite sides of the protrusion 1315 toward the corresponding two resisting blocks 1311 and connect with the corresponding two resisting blocks 1311 respectively.

Each elastic arm 133 includes a connecting portion 1331 extending from one distal end of the main body 131 and a hook 1333 integrally formed at the distal end of the connecting portion 1331. The connecting portion 1331 is to resist against the housing 20 as the key button mechanism 10 and pressed, to provide a force enabling the key button 11 to rebound from the switch 30 after the key button 11 triggers the switch 30. The hook 1333 is substantially L-shaped and is to latch with the housing 20 to secure the key button mechanism 10 within the housing 20.

The housing 20 includes a side wall 21 and a base wall 23, the side wall 21 extends from one side peripheral of the base wall 23 perpendicularly. An accommodating groove 211 is recessed from an inner surface of the side wall 21 and is to receive the key body 111 of the key button 11 therein. The outer surface of the side wall 21 defines a receiving slot 213 communicating with the accommodating groove 211 and to receive the pressing portion 113 of the key button 11 therein. The shape of the accommodating groove 211 is slightly larger than the receiving slot 213, thereby forming a peripheral bottom wall 2111 surrounding the corresponding receiving slot 213. A supporting portion 215 protrudes from the base wall 23 and connects with the inner surface of the side wall 21, and is located adjacent to the substantially middle portion of the accommodating groove 211. The supporting portion 215 is substantially hollow shaped and includes a substantially U-shaped peripheral wall 2151. The supporting portion 215 is for supporting and resisting against the protrusion 1315 of the key button mechanism 10. Two locating blocks 2153 protrude from two distal ends of the peripheral wall 2151 and is positioned adjacent to the accommodating groove 211. The two locating blocks 2153 are for resisting against the corresponding two ribs 1319 to locate the key button mechanism 10 within the housing 20. Two latching blocks 233 protrude from the base wall 23 and are located adjacent to two sides of the accommodating groove 211. The two latching blocks are to latch with the corresponding two hooks 1333 of the elastic arm 133.

Figure 3:
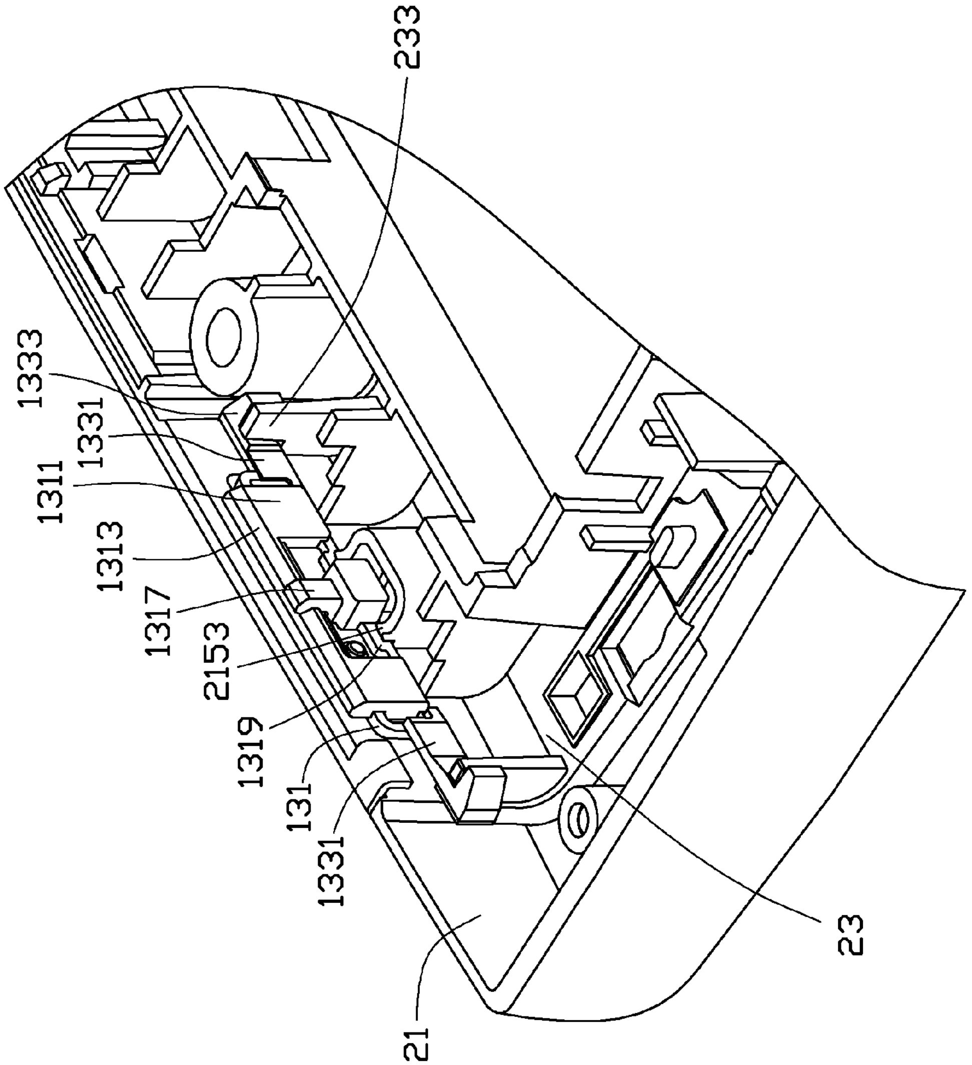
FIG. 3 is a partial assembled perspective view of the portable electronic device shown in FIG. 2.
Figure 4:
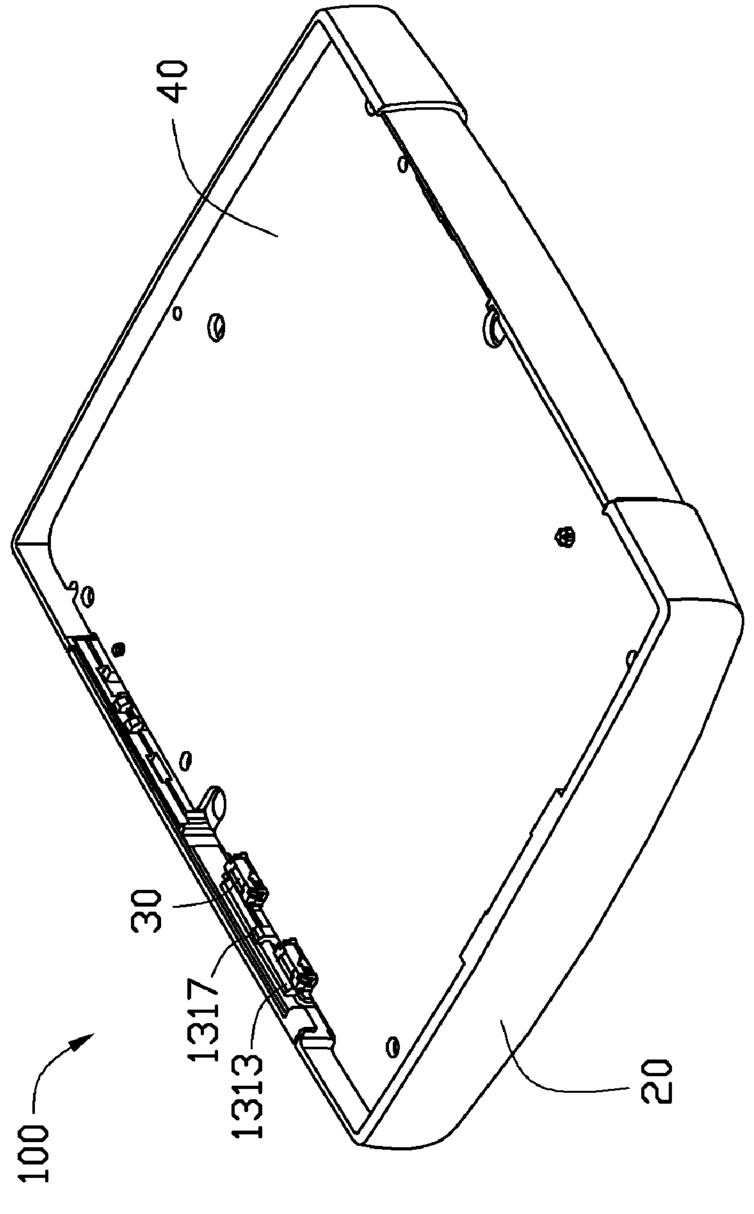
FIG. 4 is an assembled perspective view of the portable electronic device shown in FIG. 1.

Referring to FIGS. 2 through 4, in assembly, the key button mechanism 10 is detachably assembled within the housing 20. The pressing portion 113 aligns with and passes through the accommodating groove 211 and the receiving slot 213 of the housing 20 from the inner surface side of the side wall 21, and partially exposes out from the corresponding receiving slot 213. The key body 111 is accordingly received within the corresponding accommodating groove 211 and partially abuts against the peripheral bottom wall 2111 of the accommodating groove 211. The protrusion 1315 is partially surrounded by the peripheral wall 2151 and the two ribs 1319 correspondingly resist against the two locating blocks 2153. The resisting wall 1313 abuts against the inner surface of the side wall 21. The two hooks 1333 respectively latch to corresponding two latching blocks 233, then, the key button mechanism 10 is assembled to the housing 20. After that, the two switches 30 are electrically mounted to the circuit board 40 and positioned separate from each other corresponding to the key button mechanism 10. Finally, the circuit board 40 is mounted to the housing 20 and aligns with the corresponding limiting stopper 1317, the two switches 30 are accordingly positioned in front of the corresponding two resisting blocks 1311.

In use, when pressing one end of the pressing portion 113 of the key button 11, the corresponding one resisting block 1311 of the elastic element 13 is pushed by the key button 11 to move toward and resist against the corresponding one switch 30. The switch 30 is triggered to generate an electric controlling signal to the circuit board 40. Meanwhile, the connecting portion 1331 of the elastic arm 133 is deformed to generate an elastic force, the hook 1331 tightly resists against the latching block 233 of the housing 20. When the key button 11 is released, the key button 11 automatically returns to its original position by the elastic force generated by the connecting portion 1331 of the elastic arm 133.

It is to be understood, however, that even through numerous characteristics and advantages of the disclosure have been set forth in the foregoing description, together with details of the structure and function of the present disclosure, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. A key button mechanism, comprising:
- a key button; and
- an elastic element integrally formed with the key button, the elastic element comprising a main body and two elastic arms extending from the main body and located at opposite ends of the main body respectively; the main body comprising two resisting blocks protruding from one surface thereof away from the key button side and located adjacent to the opposite ends of the main body, the main body comprising a resisting wall formed aside the main body with two distal ends thereof connecting to the two resisting blocks.

2. The key button mechanism as claimed in claim 1, wherein the key button is substantially stepped shaped and comprises a key body and a pressing portion, the pressing portion and the main body of the elastic member protruding from opposite surfaces of the key body.

3. The key button mechanism as claimed in claim 1, wherein the main body further comprises a protrusion protruding therefrom and positioned between the two resisting blocks.

4. The key button mechanism as claimed in claim 3, wherein the main body further comprises a limiting stopper extending out from the protrusion toward and cross the resisting wall.

5. The key button mechanism as claimed in claim 4, wherein the main body comprises two ribs extend from opposite sides of the protrusion toward the corresponding two resisting blocks and connect to the corresponding two resisting blocks respectively.

6. The key button mechanism as claimed in claim 1, wherein each elastic arm comprises a connecting portion extending from one distal end of the main body and a hook integrally formed at a distal end of the connecting portion.

7. The key button mechanism as claimed in claim 1, wherein the key button is made of rigid plastic material, and the elastic element is made of elastic material.

8. A portable electronic device, comprising:
- a housing including a supporting portion formed by a peripheral wall, two locating blocks protruding from two distal ends of the peripheral wall;
- a circuit board assembled within the housing;
- two switches electrically mounted on the circuit board and spaced from each other; and
- a key button mechanism assembled to the housing, comprising:
  - a key button; and
  - an elastic element integrally formed with the key button, the elastic element comprising a main body and two elastic arms extending from the main body and located at opposite ends of the main body respectively; the main body comprising two resisting blocks protruding from one surface thereof away from the key button side corresponding to the two switches of the circuit board, the main body further including a protrusion and two ribs;
  - wherein the supporting portion supports and resists against the protrusion of the key button mechanism, the two locating blocks resist against the corresponding two ribs to locate the key button mechanism within the housing.

9. The portable electronic device as claimed in claim 8, wherein the key button is substantially stepped shaped and includes a key body and a pressing portion protruding from one surface of the key body, the main body protrudes from and is positioned at the opposite other surface of the key body.

10. The portable electronic device as claimed in claim 9, wherein the housing comprises a base wall and a side wall extending from the base wall, the side wall includes an accommodating groove recessed from an inner surface thereof and to receive the key body of the key button therein; the outer surface of the side wall defines a receiving slot communicating with the accommodating groove and to receive the pressing portion therein.

11. The portable electronic device as claimed in claim 10, wherein the shape of the accommodating is larger than the receiving slot, thereby forming a peripheral bottom wall surrounding the corresponding receiving slot; the key body being received within the accommodating groove and partially abutting against the peripheral bottom wall of the accommodating groove.

12. The portable electronic device as claimed in claim 10, wherein the protrusion is positioned between the two resisting blocks; the base wall includes the supporting portion protruding therefrom and located adjacent to the accommodating groove.

13. The portable electronic device as claimed in claim 12, wherein the two ribs extend out back ward from two opposite sides of the protrusion and connect with the corresponding two resisting blocks respectively.

14. The portable electronic device as claimed in claim 13, wherein each elastic arm includes a connecting portion extending from one distal end of the main body and a hook integrally formed at the distal end of the connecting portion; two latching blocks protrude from the base wall and are located adjacent to two sides of the accommodating groove; the two latching blocks are to latch with the corresponding two hooks of the elastic arm.

* * * * *